Nov. 17, 1970 J. F. MERRILL ET AL 3,541,352

VARIABLE DELAY PULSE GENERATOR

Filed Aug. 28, 1967 3 Sheets-Sheet 1

INVENTORS
JOHN F. MERRILL
HUGH R. STIRLING

BY Henry Powers
ATTORNEY

Nov. 17, 1970 J. F. MERRILL ET AL 3,541,352

VARIABLE DELAY PULSE GENERATOR

Filed Aug. 28, 1967 3 Sheets-Sheet 2

United States Patent Office 3,541,352
Patented Nov. 17, 1970

3,541,352

VARIABLE DELAY PULSE GENERATOR

John F. Merrill, Wappingers Falls, and Hugh R. Stirling, Poughkeepsie, N.Y., assignors to International Business Machines Corporation, Armonk, N.Y., a corporation of New York Filed Aug. 28, 1967, Ser. No. 663,590
Int. Cl. H03k 5/08
U.S. Cl. 307—237 16 Claims

ABSTRACT OF THE DISCLOSURE

A pulse delay generator which has a delay proportionately to a control voltage. The delay is achieved by use of a double ramp technique. An input signal starts a current source to create a first ramp which is used to initiate a second ramp through a switching diode which also isolates the second ramp from any input disturbances. The control voltage sets the starting level of both ramps. The use of the double ramp technique coupled with the use of only the diode component which is switched by the first ramp, to initiate the second ramp, prevents any of the input transients from disturbing the second ramp. Thus, linearity between the control voltage and delay is achieved.

FIELD OF THE INVENTION

This invention relates to electrical pulse generators, and particularly to such circuits for producing a pulse having an accurately predetermined and adjustable time delay after an initiating input pulse.

THE PRIOR ART

Ramp and pulse generators find wide application in numerous electronic systems, such as radar range and display tracking circuitry, pulse delay circuitry, time based circuitry for analog-to-digital converters, and voltage control oscillators. In these and other applications, the use of a related delay circuit finds increasing importance for various pulse techniques which require extensive use of pulse circuits which can not only reproduce pulse delays of microseconds and milliseconds but which also require the ability to accurately control the duration of the delay periods. Accordingly, there is a growing need for accurate and stable time delay circuits in the electronic computers, testing equipment and for scores of other applications and systems.

SUMMARY OF THE INVENTION

In its broadest aspect, the invention comprehends the use of an input initiated ramp generator to isolate a second ramp generator which is completely independent of the remaining circuitry and thus provide an accurate ramped linear output having a 25 ps. linearity within a 10 nanosecond range. Such an arrangement of two ramp generators reduces the effects of non-linear capacitance out of the output of the second generator. Another feature of the invention involves a continued isolation of the second generator until the set output voltage is reached. This feature enables a very accurate control in the desired delay of the output ramp voltage by varying the initial base voltage to the generators. Accordingly, a further feature of this invention comprehends the use of a plurality of reference voltages for establishing corresponding base voltage levels of the generator outputs, by which, conversely, output pulses can be obtained of controlled delay and accuracy. Also comprehended within the invention is the use of pulse shaping circuitry to provide sharp-spiked strobe pulses with accurately predetermined and adjustable time delays corresponding to those of the ramped output obtained by the waveform generating circuits.

Accordingly, it is an object of this invention to provide a new and improved pulse generating circuit which produces an output pulse having an accurate and controlled delay.

Another object of this invention is to provide a new and improved pulse generator which produces an output pulse having a delay which is proportional to a reference control.

A further object of this invention is to provide a new and improved pulse generator which produces a strobe-type output pulse having a delay which is proportional to applied reference control voltages.

A still further object of this invention is to provide a new and improved pulse generator which produces an output pulse which is delayed by a fixed amount of time proportional to the circuit to be employed plus an increment of delay which is a linear function of applied reference control voltages.

It is also an object of this invention to provide a new and improved pulse generator which produces a strobe-type output pulse which is delayed a fixed amount of time proportional to the circuitry employed plus an increment of delay which is a linear function of applied reference control voltages.

The foregoing and other objects, features and advantages of the invention will be apparent from the following more particular description of the preferred embodiments of the invention as illustrated in the accompanying drawings.

DESCRIPTION OF THE PREFERRED EMBODIMENTS

Figure 1:
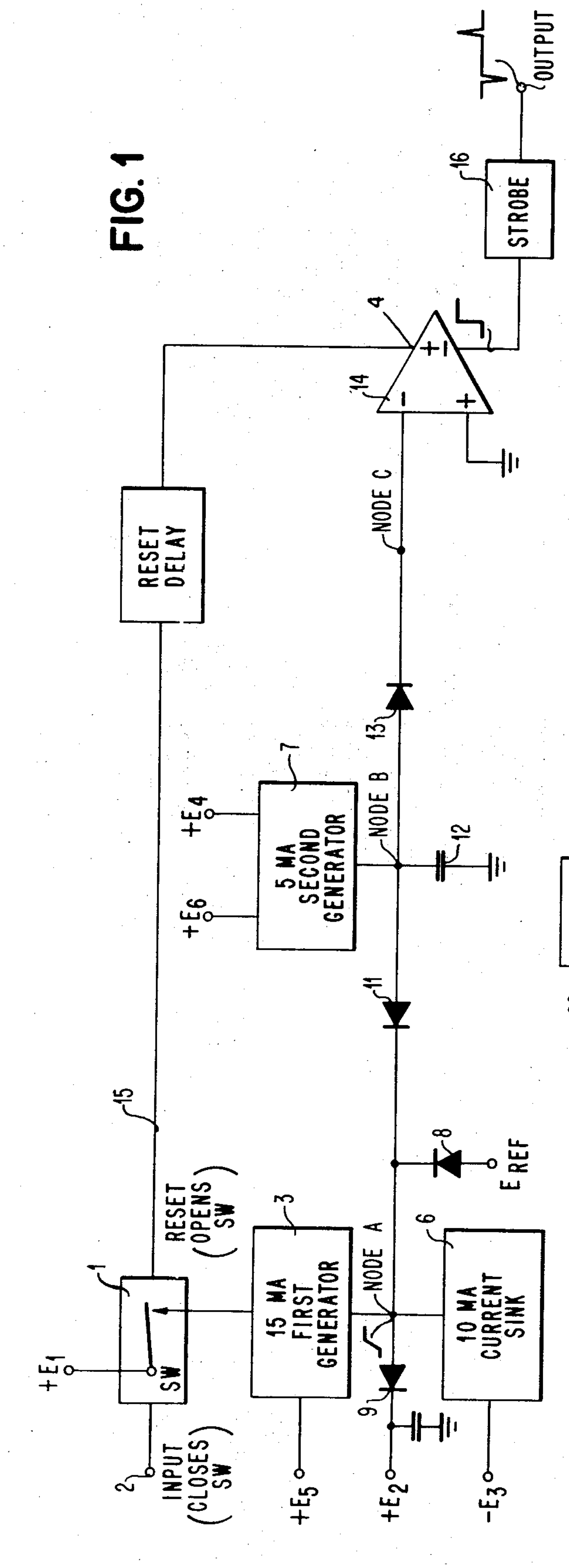
FIG. 1 is a partly schematic and partly block diagram illustrating an embodiment of the invention.

Referring to the drawings, and more particularly to FIG. 1, the generator circuit shown therein may be seen to include a switch circuit 1 which is "closed" by a positive input pulse at the input terminal 2. Closing its switch 1 energizes a 15 ma. generator 3 which supplies 15 ma. to Node A. Switch 1 is "opened" by a negative pulse from the output 4 of an amplifier 14. Opening of switch 1 de-energizes the 15 ma. generator 3.

Initially with switch 1 open, Node A is held negative because the sum of the node currents from the 10 ma. current sink 6 and the 5 ma. generator 7, is respectively, —10 and +5, to provide a total of —5 ma. which causes Node A to be clamped the $-E_{REF}$ through the diode 8. When a positive input pulse "closes" switch 1, the current summation in Node A changes to the sum of the currents from the generator 3 and the current sink 6 which is respectively +15 and —10 ma. for a total of +5 ma. This initiates a linear ramp rise at Node A which is clamped, after its positive rise, to the voltage $+E_2$ through the diode 9. The rise at Node A very quickly back-biases diode 11 permitting the now isolated 5 ma. generator 7 to charge the capacitance 12 shunted ramp at Node B. The ramp output at Node B rises positively until diode 13 becomes forward biased, at which time a comparator circuit means, such as amplifier 14, will reset the generator 3 by means of the feedback delay line 15 to switch 1, while concurrently triggering the strobe generator 16. The output pulse of amplifier 14 opens switch 1, which de-energizes the generator 3 to restore the initial conditions to Nodes A and B. This cycle is repeated with each positive input pulse.

The accuracy of the variable delay of this invention depends on the linearity of the ramp at Node B. To achieve this, the generator 7 supplies a current which is constant to within ±.5% to charge the capacitance ramp at Node B. The other component of the ramp linearity is a constant of the C ramp whose capacitance can be $$C_{12}=C_{\text{fixed}}+\frac{(C_{\text{D-11}}\times C_{\text{total at A}})}{(C_{\text{D-11}}+C_{\text{total at A}})}+\frac{(C_{\text{D-13}}\times C_{\text{total at C}})}{(C_{\text{D-13}}+C_{\text{total at C}})}+C_{Q46}$$

where D-11 and D-13 are diodes 11 and 13, and Q46 (FIG. 3) is transistor 46.

Since in the invention described, diode 13 is back-biased during ramp time, the circuit of its capacitance is very small, so that the third term of the sum diminishes to a capacitance smaller than that of diode 13 itself. By the use of the unique pre-ramp at Node A whose rate of rise is designed in the specific circuit to be approximately twice that at Node B, diode 11 also becomes back-biased during ramp time, so that the second term of the sum also diminishes to a capacitance smaller than that of diode 11 itself. As a result of this embodiment of the invention, there is a very much smaller total variation in capacitance at the C-ramp, than would otherwise be the case.

Figure 2:
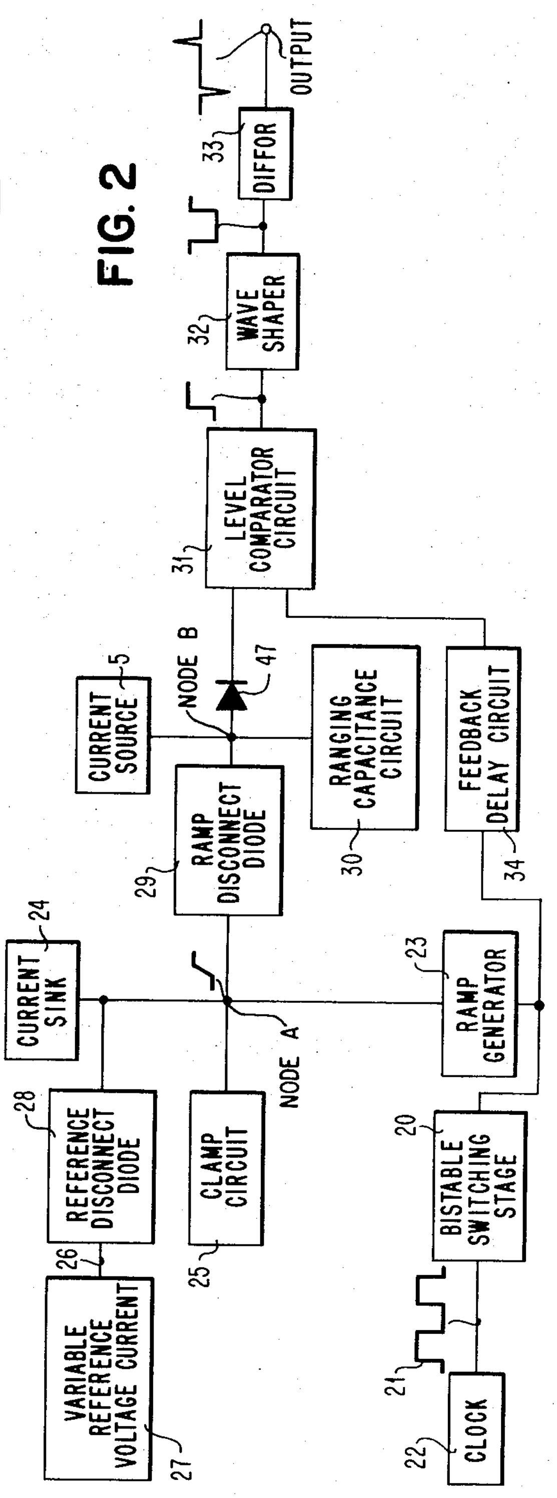
FIG. 2 is a schematic drawing showing the preferred operating form of the invention.
Figure 3:
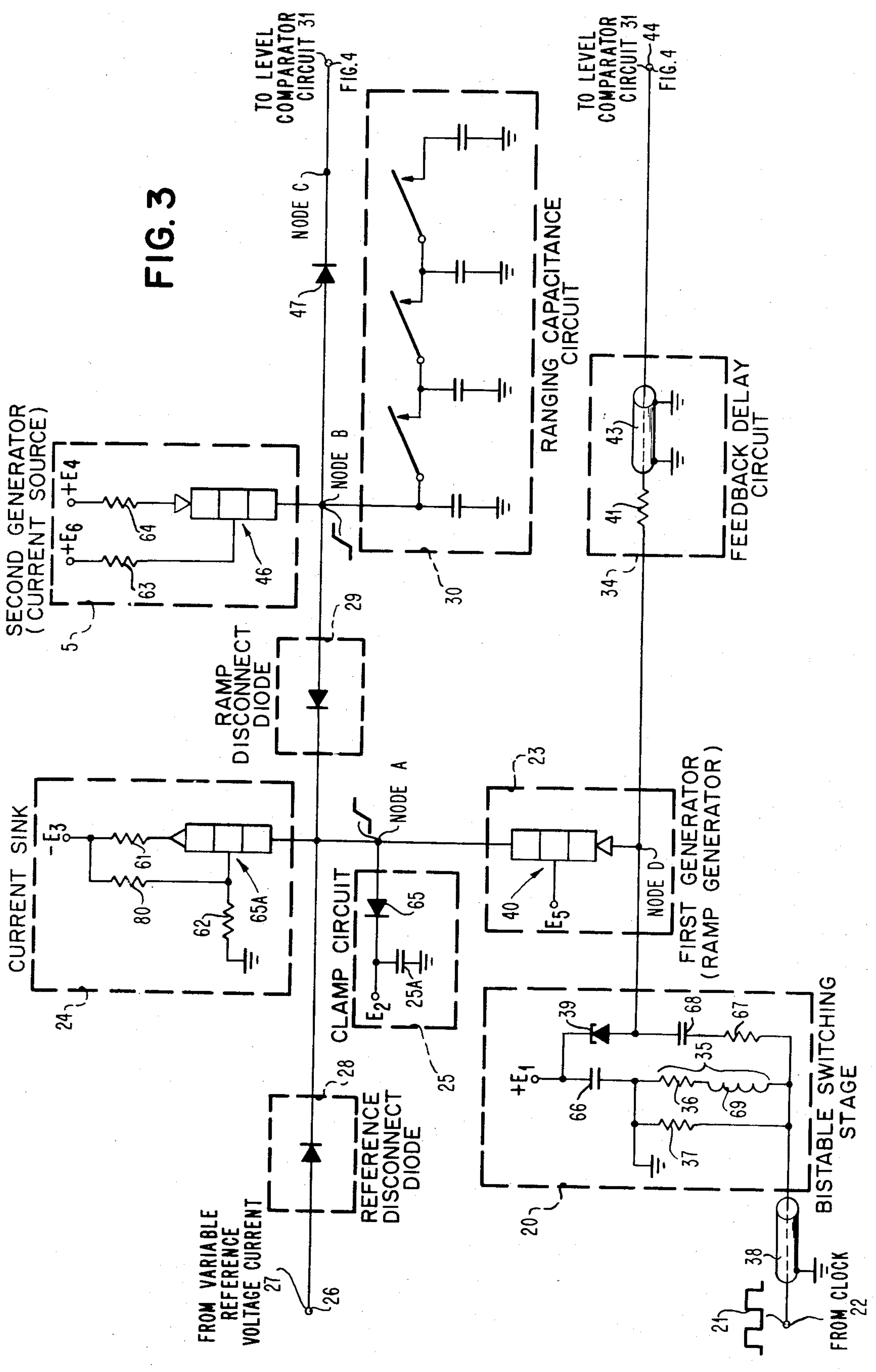
FIGS. 3 and 4 are drawings illustrating specific circuits implementing the system shown in block form on FIG. 2.
Figure 4:
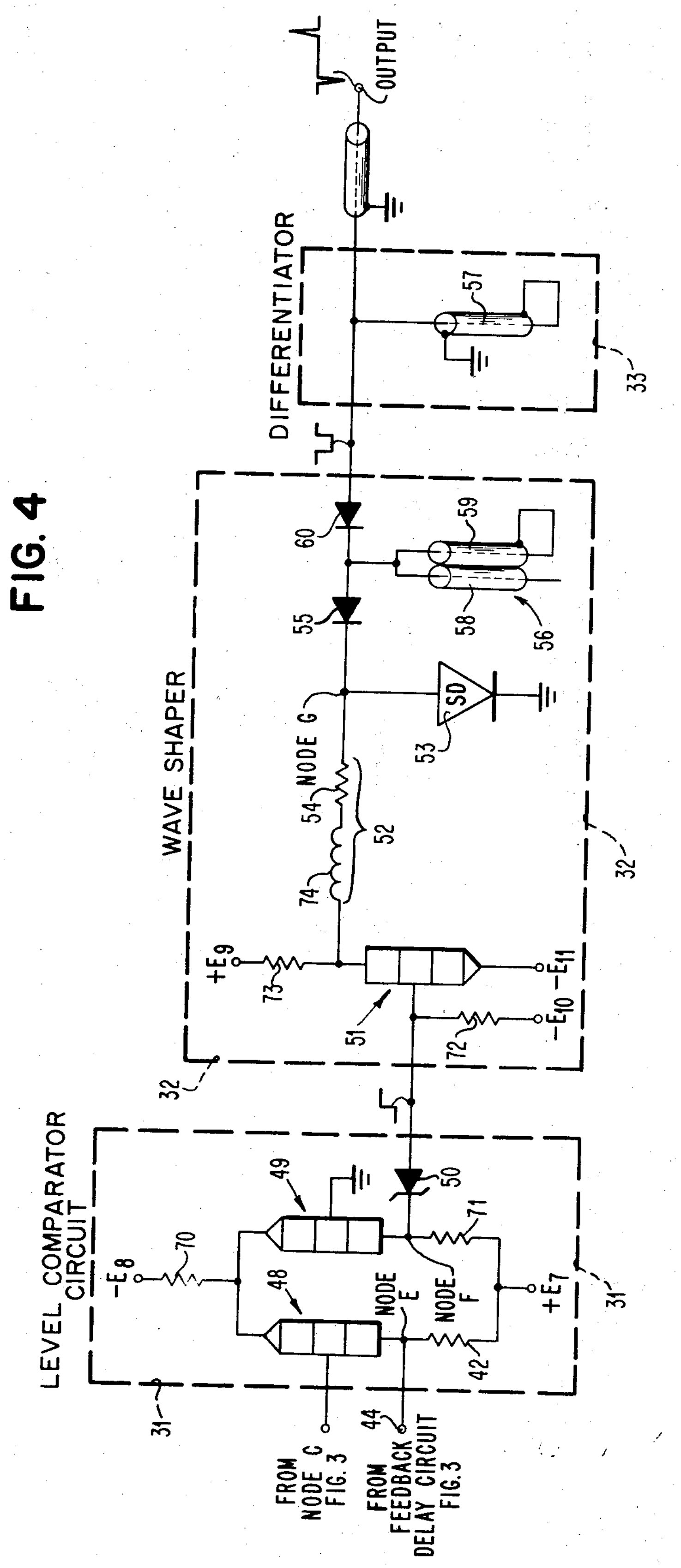

More specifically with reference to FIGS. 2–4, the circuit of this invention as embodied in an actual system included a bistable switching stage 20 (e.g. switch 1) which under the stimuli of a series of pulses 21 from a sync or clock pulse generator 22, is used to turn on a 15 ma. current generator 23, e.g. first generator 3 of FIG. 1). This current step provides the current required by a 10 ma. current sink 24 (e.g. sink 6 of FIG. 1) with an additional 5 ma. available to charge the capacitance (i.e. about 5 pf.) at Node A which is clamped to a fixed voltage by clamp circuit 25. It is noted, that before the current step occurred, the 10 ma. current sink 24 was drawing its current from the reference input terminal 26, connected to a variable reference source 27, and from a 5 ma. current generator 27, through their respective disconnect diodes 28 and 29. As a result, this condition of the circuit makes Node B initially equal in potential to the selected voltage level of reference source 27. Thus, the two diodes 28 and 29 have equal currents flowing through them and therefore equal voltage drops; and with equal temperature coefficients associated with the diodes 28 and 29, each compensates for the other during operation.

When the indicated current step occurs, both diodes 28 and 29 will be turned off. Node B is provided, in accordance with this invention, with more shunt capacity (i.e. about 10 pf.) from the capacitance ranging circuit 30; and since both Nodes A and B have 5 ma. available to charge their shunt capacities, the voltage at Node A will rise faster than the voltage at Node B and thus turn off diode 29. As a result, the reverse biased diode 29 at this point separates all transients from Node B. Each of disconnect diodes 28 and 29 employed is a majority carrier diode so that reverse recovery is not a problem.

In the specific system described, the reference voltages employed are negative voltages, and thus the voltage at Node B will always rise to ground. A level comparator 31, which is connected to Node B through diode 47, will switch when the voltage at Node B reaches ground. The trigger and output stage which includes a wave shaper circuit 32 and a differentiator circuit 33.

In addition the level comparator 31 is also connected through a feedback delay circuit 34 to the input of the bistable switching stage 20 whereby the bistable stage is reset after a short delay. Resetting of the bistable switching stage 20 turns off the 15 ma. current generator 23, and allows the 10 ma. sink 24 to restore both Node A and Node B to their initial voltage levels.

The delay obtained in the trigger pulse from the level comparator 31 with respect to the sync or clock pulse 21 is a linear function of the reference voltae input selected from the voltage source 27. In addition, the changing of the shunt capacity at Node B by means of the capacitance ranging circuit 30 will also provide a corresponding change in the slope of the ramp at Node B, and thus, likewise, also change the scale factor or range of the delay circuit.

In operation, the triggering of the bistable stage 20 is with, preferably, a purely resistive input to prevent reflections back to source of the sync pulse 21. This is obtained by means of the series inductor-resistor circuit 35 shown in the bistable switching stage 20 in FIG. 3.

A 430 ohm value is employed for the series resistor 67 so that a 2.5 volt sync pulse 9 would supply an excess of 5 ma. to the bistable diode circuit 20. A 56.6 ohm value was used for resistor 37 to match the circuit to a 50 ohm coaxial input 38. The time constant of the resistor 67 and capacitor 68 is long enough so that the input rise time of the sync pulse 21 will not be degraded when it is coupled into the tunnel diode 39 of the bistable switching stage 20. Also the time constant obtained was sufficiently short to avoid high repetition rate effect spread.

The tunnel diode 39 selected for use in the system was a 22 ma. GE TD254A, which in the circuit described was biased with 19 ma. in the low voltage state. The voltage across tunnel diode 39 in the high state was limited to about 0.4 volt by means of a transistor 40 of the first ramp generator 23. The resultant current into the Node D was 17 ma., 2 ma. of which are required to hold the tunnel diode 39 in the high state, and the remaining 15 ma. supplied to Node A through transistor 40. For this particlar circuit, transistor 40 is a germanium transistor to assure proper current division when tunnel diode 39 switches. However, the $E_1$ power supply can be adjusted to compensate for any variation in the particular tunnel diode 39 employed in the circuit.

A 150 ohm load line employed in conjunction with tunnel diode 39 was composed of two resistors, a 100 ohm value resistor 41, of the feedback delay circuit 34 (shown in FIG. 3) and a remote 50 ohm value resistor 42 (of the level comparator circuit 31 in FIG. 4) which is connected in series with resistor 41 through a 50 ohm transmission line 43 so that any signals that originate at Node D will be absorbed at Node E whereby the load line for tunnel diode 39 will remain resistive. The purpose of Node E is to provide access at a terminal 44 for a reset output pulse from the comparator circuit 31 which is fed back to tunnel diode 39 to return it to its low voltage state. In addition the transmission line 43 also forms part of the feedback delay circuit 34 to provide a delay for the reset pulse.

To initiate the ramp at Node B only the tunnel diode 39 and the grounded base transistor 40 were required to switch-on. Thus, since this is all the current mode switching, a minimum delay is attained in initiating the ramp at Node B. Turning off of diode 28 by the rising ramp at Node A isolates Node A from the reference voltages, of the reference source 27; and the turning off of diode 29 isolates Node B from Node A. The linearity of the ramp at Node B is dependent upon the linearity of the 5 ma. current generator 5 versus the voltage, and the linearity of the shunt capacity of circuit 30 versus the voltage generated. By biasing the base of transistor 46 at +6 v. DC and only allowing the ramp to operate from −6 v. to 0 v., any change in current was minimized. It was found that three components tended to contribute to non-linear shunt capacity at Node B, e.g. diode 29, transistor 46 and diode 47. Normally as the ramp rose at Node B, the voltage across diode 29 and the base emitter junction of transistor 46 would decrease to tend to cause their contribution to shunt capacity to increase.

As will be appreciated, a change in capacity across the base-collector junction of the transistor is greatest when the voltage across it is the least. Accordingly, the base of transistor 46 was biased at 6 volts to assure that the voltage across the junction would be at least 6 volts during the ramp time. The shunt capacity of the diodes is of the order of just a few tenths of a pf., and since the capacity of diode 47 is in series with the capacity of transistor 48, in the level comparator circuit 31, this makes the equivalent shunt capacity caused by diode 47 to be less than its own capacity. Because the ramp at Node A is rising faster than the ramp at Node B, the capacity across diode 47 is actually caused to subtract its value from the total shunt capacity at Node B. As the voltage at Node B increases, the voltage drop across diode 29 also increases which decreases its shunt capacity. Thus, in accordance with this circuit, the total effect of these components is to cause the effective slope of the longer ramp, at Node B, to be faster than the effective slope of the shorter ramp. For the long ramp, at Node B, the voltage at Node A will be clamped thus causing the capacitance of diode 29 to be added to the total shunt capacity at Node B instead of being subtracted from it. This will cause the effective slope of the longer ramps to be slower and more like the shorter ramp.

The level comparator 31 includes the two transistors 48 and 49 which are connected as a differential pair with an emitter current of 50 milliamps. Transistor 49 is normally on and transistor 48 is normally off. When the ramp at Node B starts to go above ground, it will begin to turn on transistor 48 and switch the current from transistor 49 to transistor 48 and into Node E which has an initial load of 25 ohms where the specific load consisted of a 50 ohm resistor 42 and a 50 ohm transmission line 43 of the feedback delay circuit 34.

The transmission line routes the signal back to the input bistable switching stage 20 and resets it, and eventually returns the ramp to its original voltage, e.g. the reference voltage selected from the variable reference source 27.

The signal from the level comparator 31 at Node F is used as the output signal for the next stage which includes the wave shaper circuit 32 and the differentiator circuit 33. In operation, since transistor 49 is normally on, its power dissipation is important but in this case when it is on, the voltage across it will be less than a volt since the current it is drawing is controlled at 50 ma., to thus control power in it to less than 50 milliwatts, well within its rating. A Zener diode 50 is used to couple the signal at Node F into the base of a transistor 51 of the wave shaper circuit 32. As a result, the transistor 51 will switch on and its collector will move to −6 volts from an initial +.8 volt applied through an RL network 52 from a snap diode 53 which was biased at 15 ma. in the circuit.

The LR time of the network is approximately 12 nanoseconds which is short enough to allow the reverse current flowing to the snap diode 53 to build up significantly before it snaps, but still long enough so that the leading edge of the step which occurred at Node G is not loaded down by the 27 ohm value resistor 54. This step is coupled through diode 55 into the transmission line network 56 of the wave shaper circuit 32. The transmission line network 56 functions to convert a current step waveform into a voltage pulse which is fed to the differentiator circuit 33 where it is converted into a negative and positive spike by differentiation accomplished by means of a 4 inch shorted transmission line stub 57. The spacing between the spikes, and accordingly, the length of the voltage pulse from the wave shaper circuit 32 is determined by a pair of five foot transmission lines 58 and 59 in the wave shaper circuit 32.

The two five foot line stubs 58 and 59, are each 50 ohm transmission lines (one open and one shorted) which are electrically identical to a single ten foot 25 ohm shorted line. By means of the combination of these two five foot transmission lines in the circuit, a first pair of reflections was obtained from the ends of the lines which are equal in magnitude but opposite in polarity which causes total re-reflection, while a second pair of reflections are equal in magnitude and polarity. The two transmission line stubs 58 and 59 are separated from the output cable and the four inch shorted stub 57 by diode 60 to isolate the output from any small disturbances caused by multiple reflections in the two longer lines. In the circuit described, the propagation delay of the cable was 1.5 nsecs./ft. to establish the width of the reset and strobe pulses to 1 nanosecond, and the spacing between them to 30 nanoseconds (e.g. 1.5 nsec./ft.×5 ft.×4).

In an actual system constructed in accordance with this invention, the following components, currents, and voltages were employed which had the following values:

| | | |
|---|---|---|
| Voltages: | | |
| | $+E_1=+3.0$ v. DC | $+E_7=6$ v. DC |
| | $+E_2=+2.5$ v. DC | $-E_8=-15$ v. DC |
| | $-E_3=-15$ v. DC | $+E_9=+15$ v. DC |
| | $E_4=+15$ v. DC | $-E_{10}=-15$ v. DC |
| | $+E_5=+6$ v. DC | $-E_{11}=-6$ v. DC |
| | $+E_6=+6$ v. DC | |
| Resistors: | | |
| | **36**—430 ohms | **64**—1.6K ohms |
| | **37**—56.6 ohms | **67**—430 ohms |
| | **41**—100 ohms | **70**—270 ohms |
| | **42**—50 ohms | **71**—110 ohms |
| | **54**—27.4 ohms | **72**—15K ohms |
| | **61**—560 ohms | **73**—510 ohms |
| | **62**—910 ohms | **80**—620 ohms |
| | **63**—100 ohm Reductor | |
| Capacitors: | | |
| | **25A**—100 mfd. | **68**—18 pfd. |
| | **66**—.1 mfd. | |
| Transistors: | | |
| | **40**—2N2929 | **49**—2N2369 |
| | **46**—2N2929 | **51**—2N3426 |
| | **48**—2N2369 | **65A**—2N3960 |
| Coils: | | |
| | **69**—3.3 μhenries | **74**—0.33 μhenry |
| Tunnel Diodes: | | |
| | **39**—G.E. TD254A | |
| Zener diode: | | |
| | **50**—1N4736A | |
| Snap diode: | | |
| | **53**—hp0113 | |
| Diodes: | | |
| | **28**—hp2301 | **55**—hp2301 |
| | **29**—hp2301 | **60**—hp2301 |
| | **47**—hp2301 | |

This specific circuit was employed to provide a sharp spiked strobe pulse for use as a sampling pulse for the pulse measuring system of copending application, U.S. application Ser. No. 663,710, filed Aug. 28, 1967, by John F. Merrill and assigned to the assignee of this application.

However, while the invention has been particularly shown and described with reference to the preferred embodiments, it will be understood by those skilled in the art that various changes in form and detail may be made therein without departing from the spirit and scope of the invention.

What is claimed is:

1. A variable pulse delay circuit comprising:
- a pair of diodes having the cathodes thereof connected in common;
- an initial ramp voltage generator adapted to be activated in response to reference time signal and having the output thereof connected to the common terminal of said diodes;
- means for selectively establishing a predetermined variable reference voltage to the anode of one of said diodes to establish a corresponding base voltage for said ramp generator;

a second independent linear ramp generator having the output thereof connected to the anode of the other of said diode;

a third diode having the anode thereof connected to said common terminal;

means for impressing a potential at the cathode of said third diode to establish the cut-off voltage of said first generator;

a fourth diode having the anode connected to the output of said second generator; and an output terminal connected to the cathode of said fourth diode.

2. The circuit of claim 1 including a comparator circuit means having a first input connected to said output terminal and a second input connected to a second reference voltage said comparator having a first output for providing an output command signal when the waveform at the output of said second generator reaches the magnitude of said second reference source; and a second output for deriving a reset signal for resetting said first generator.

3. The circuit of claim 2 including means for providing a plurality of said reference time signals for control of the operating state of said first generator; and a delay circuit means responsive to said reset signal for resetting said first generator in a timed delay.

4. The circuit of claim 3 including a fourth pulse generator for generating a square wave control pulse of predetermined width in response to said command signal.

5. The circuit of claim 4 including a differentiator circuit means responsive to said square wave for providing a sharp spiked pulse of positive polarity when said control pulse changes in a positive direction and a sharp spike pulse of negative polarity when said control pulse changes in a negative direction.

6. The circuit of claim 5 including a tunnel diode circuit means biased for bistable operation, and interconnected between the first said generator and, both, said reference time pulses and said delay circuit means; and means connecting said time pulses to said tunnel diode circuit means for control of the operating state thereof.

7. An electronic generator for providing a controllably varied delay in the output pulse thereof, comprising:

(A) a ramp generator;

(B) means for activating said generator in response to an input signal;

(C) a source containing a plurality of reference potentials for establishing a corresponding starting base voltage for the output of said generator from which a linear voltage is initiated thereat;

(D) a clamping diode connected between said source and the output of said generator for maintaining said output at the magnitude of a value selected from said source of reference potential;

(E) a second source of reference potentials for establishing the cutoff voltage of the output of said generator; and (F) a disconnect diode connected between said second source and the output of said generator.

8. The generator of claim 7 including a shunt capacitor connected between the output of said generator and a third source of reference potential.

9. The generator of claim 8 including:

(A) a fourth source of reference potential;

(B) a current source responsive to said fourth source for generating a continuous flow of current;

(C) a coupling diode interconnected between the output of said current source and the output of said generator with one terminal thereof adjacent a like terminal of said first clamping diode; and (D) current sink means for maintaining said flow of current and for maintaining equal potentials at the output of said current source and said first source reference potentials prior to initiation of said generator.

10. The generator of claim 9 including:

(A) a fifth source of reference potential;

(B) a second shunt capacitance connected between the output of said current source and said fifth source of reference potential, with said second capacitance having a controllably variable capacitance of magnitude.

11. The generator of claim 10 where the said third and fifth sources of reference potentials are equal.

12. The generator of claim 10 including:

(A) a sixth source of reference potential; and (B) a comparator circuit means for providing an output control signal and having a first input connected to said sixth source of reference; and (C) a second coupling diode connected between the output of said current source and a second input of said comparator circuit means.

13. The ramp generator of claim 12 including:

(A) a feedback means having a delay circuit therein and connected between the output of said comparator circuit means and said initiating means for resetting said generator to the inactive state.

14. The ramp generator of claim 13 wherein the said third, fifth and sixth sources of reference potentials are equal.

15. The ramp generator of claim 13 including a pulse generator responsive to said control signal to provide a stepped output pulse coincident in time with said control signal.

16. The ramp generator of claim 15 including a differentiating circuit means for providing a sharp-spiked pulse when said stepped output pulse changes polarity.

References Cited

UNITED STATES PATENTS

| | | | |
|---|---|---|---|
| 2,864,556 | 12/1958 | Raymond | 328—127 |
| 2,879,392 | 3/1959 | Mudie | 328—181 X |
| 2,980,866 | 4/1961 | Naines | 328—181 X |
| 3,020,483 | 2/1962 | Losee | 328—110 |
| 3,035,184 | 5/1962 | Walker et al. | 328—183 |
| 3,297,883 | 1/1967 | Schulmeyer et al. | 307—228 |
| 3,395,293 | 7/1968 | Perloff | 307—228 |

DONALD D. FORRER, Primary Examiner

J. D. FREW, Assistant Examiner

U.S. Cl. X.R.

307—228, 293, 294; 328—127, 181, 183, 186